United States Patent
Haba et al.

(10) Patent No.: US 9,355,996 B2
(45) Date of Patent: May 31, 2016

(54) MICROELECTRONIC PACKAGE WITH CONSOLIDATED CHIP STRUCTURES

(71) Applicant: Invensas Corporation, San Jose, CA (US)

(72) Inventors: Belgacem Haba, Saratoga, CA (US); Richard Dewitt Crisp, Hornitos, CA (US); Wael Zohni, San Jose, CA (US); Ilyas Mohammed, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/837,561

(22) Filed: Aug. 27, 2015

(65) Prior Publication Data

US 2015/0371968 A1    Dec. 24, 2015

Related U.S. Application Data

(63) Continuation of application No. 13/778,654, filed on Feb. 27, 2013, now Pat. No. 9,123,600.

(51) Int. Cl.
*H01L 21/00* (2006.01)
*H01L 25/065* (2006.01)
(Continued)

(52) U.S. Cl.
CPC ............ *H01L 25/0652* (2013.01); *H01L 23/13* (2013.01); *H01L 23/3128* (2013.01); *H01L 23/49816* (2013.01); *H01L 23/49838* (2013.01);
(Continued)

(58) Field of Classification Search
CPC ............... H01L 29/7869; H01L 2224/48091; H01L 2924/00; H01L 29/24; H01L 33/62; H01L 2924/00014; H01L 29/66969; H01L 27/1225; H01L 2924/0002; H01L 25/50; C09D 5/24; C09D 11/02; C09D 11/36; C09D 5/00
USPC ......... 257/774, 330, 89, 98, 331, 371, 43, 48, 257/620, 666, 667, 674, 675, 678, 680, 712, 257/784, 99; 438/104, 716, 109, 116, 122, 438/127, 15, 232, 238, 28, 33, 462, 474, 48, 438/54, 612, 637, 64, 702, 704, 715
See application file for complete search history.

(56) References Cited

U.S. PATENT DOCUMENTS

2004/0016999 A1* 1/2004 Misumi .................. H01L 24/49
257/678
2005/0098871 A1   5/2005 Fuergut et al.
(Continued)

FOREIGN PATENT DOCUMENTS

KR   20090043898 A    5/2009
KR     101003393 B1   12/2010

OTHER PUBLICATIONS

International Search Report and Written Opinion for Application No. PCT/US2014/018559 dated Jul. 17, 2014.

*Primary Examiner* — Robert Bachner
(74) *Attorney, Agent, or Firm* — Lerner, David, Littenberg, Krumholz & Mentlik, LLP

(57) ABSTRACT

A chip package has multiple chips that may be arranged side-by-side or in a staggered, stair step arrangement. The contacts of the chips are connected to interconnect pads carried on the chips themselves or on a redistribution substrate. The interconnect pads desirably are arranged in a relatively narrow interconnect zone, such that the interconnect pads can be readily wire-bonded or otherwise connected to a package substrate.

20 Claims, 8 Drawing Sheets

(51) Int. Cl.
*H01L 23/13* (2006.01)
*H01L 23/538* (2006.01)
*H01L 23/31* (2006.01)
*H01L 23/498* (2006.01)
*H01L 23/525* (2006.01)
*H01L 25/10* (2006.01)
*H01L 23/00* (2006.01)

(52) U.S. Cl.
CPC .......... *H01L 23/525* (2013.01); *H01L 23/5384* (2013.01); *H01L 23/5385* (2013.01); *H01L 24/49* (2013.01); *H01L 25/0655* (2013.01); *H01L 25/105* (2013.01); *H01L 2224/32225* (2013.01); *H01L 2224/4824* (2013.01); *H01L 2224/48091* (2013.01); *H01L 2224/48227* (2013.01); *H01L 2224/73215* (2013.01); *H01L 2225/0651* (2013.01); *H01L 2225/06513* (2013.01); *H01L 2225/06548* (2013.01); *H01L 2225/06562* (2013.01); *H01L 2225/06572* (2013.01); *H01L 2225/107* (2013.01); *H01L 2225/1023* (2013.01); *H01L 2225/1052* (2013.01); *H01L 2924/15311* (2013.01)

(56) References Cited

U.S. PATENT DOCUMENTS

| | | |
|---|---|---|
| 2008/0185702 A1 | 8/2008 | Camacho et al. |
| 2010/0237471 A1* | 9/2010 | Pagaila ............... H01L 21/486 257/621 |
| 2011/0285020 A1 | 11/2011 | Haba et al. |
| 2012/0018887 A1 | 1/2012 | Ye et al. |
| 2012/0061856 A1 | 3/2012 | Vora |

* cited by examiner

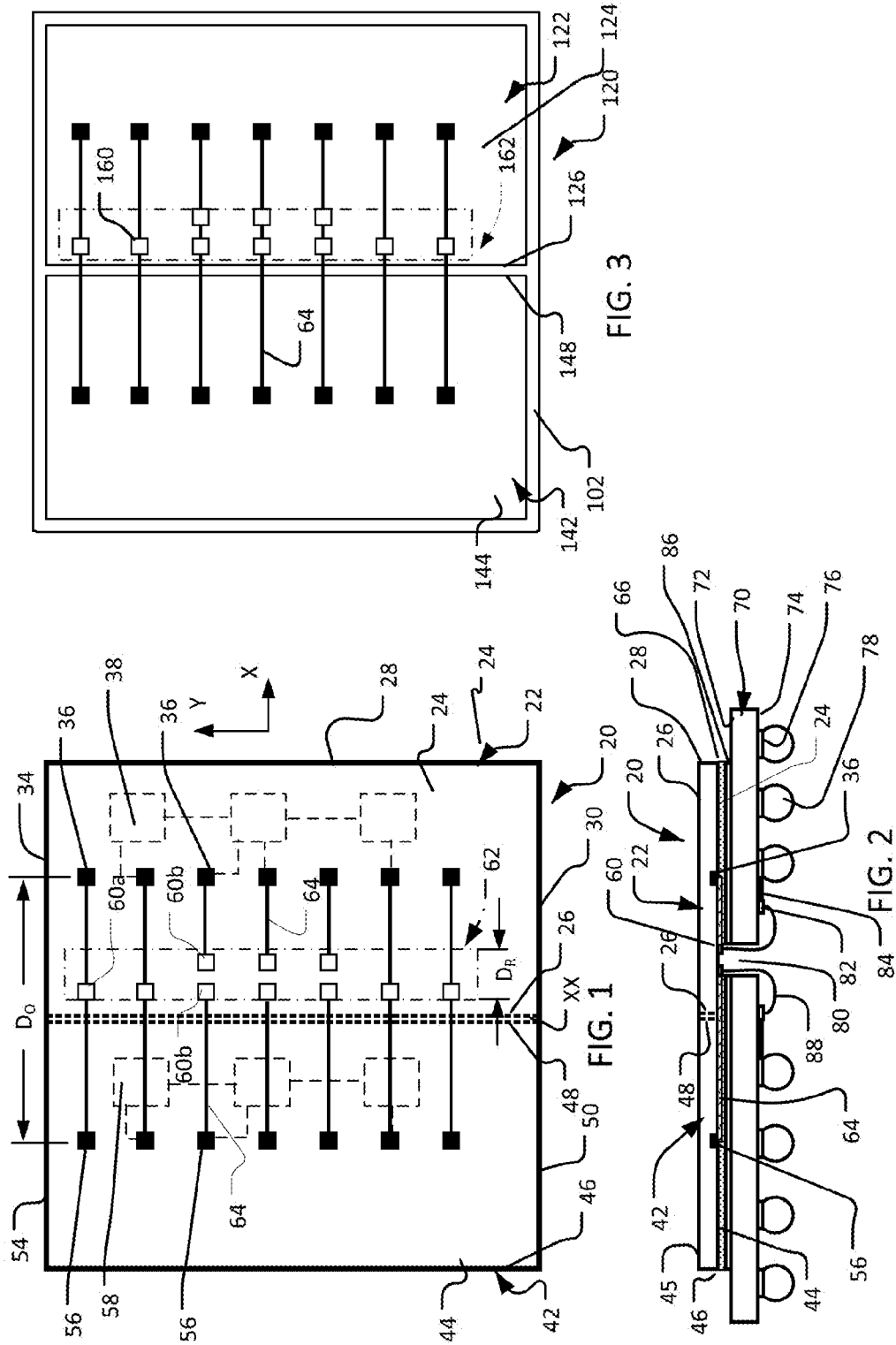

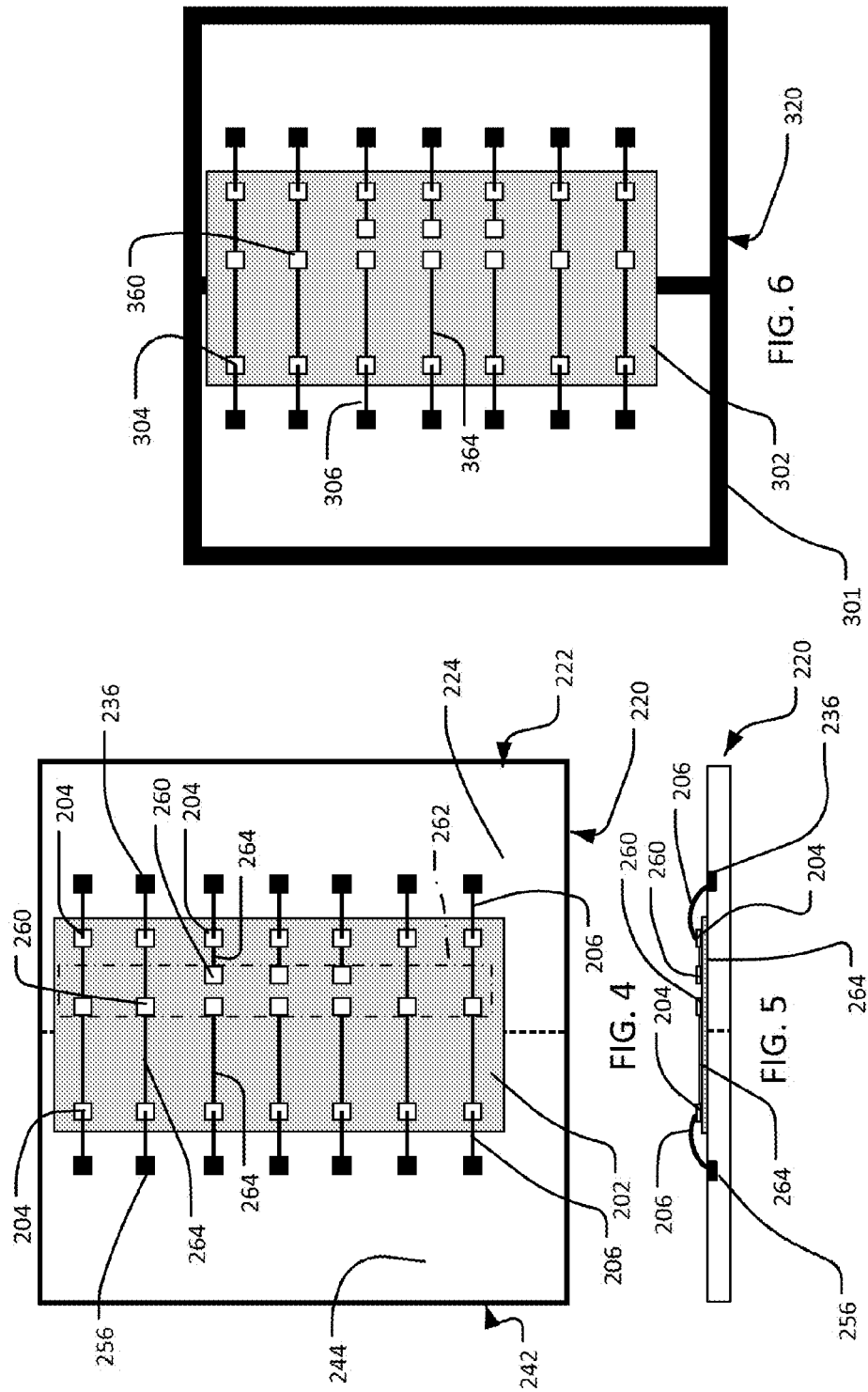

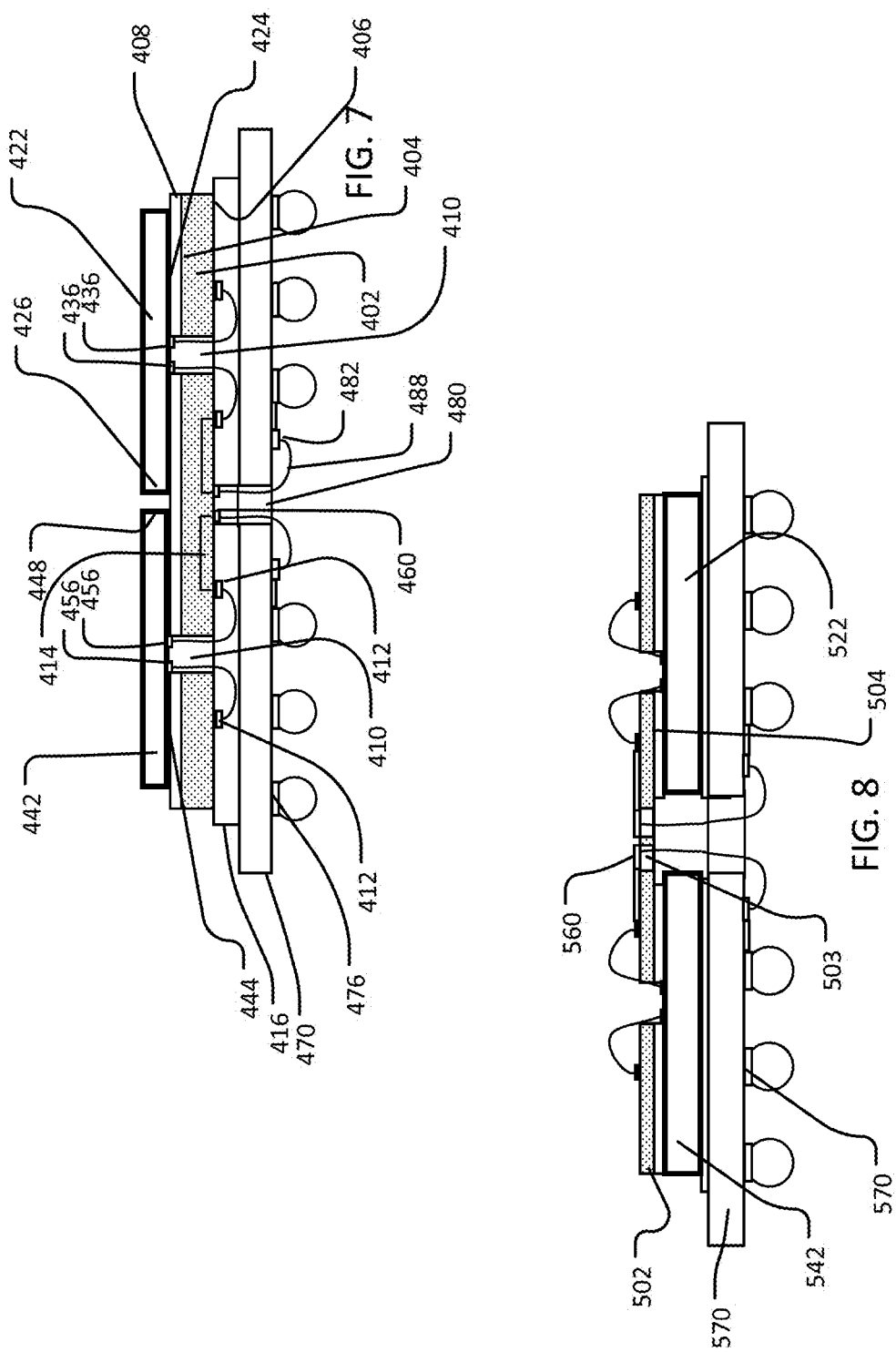

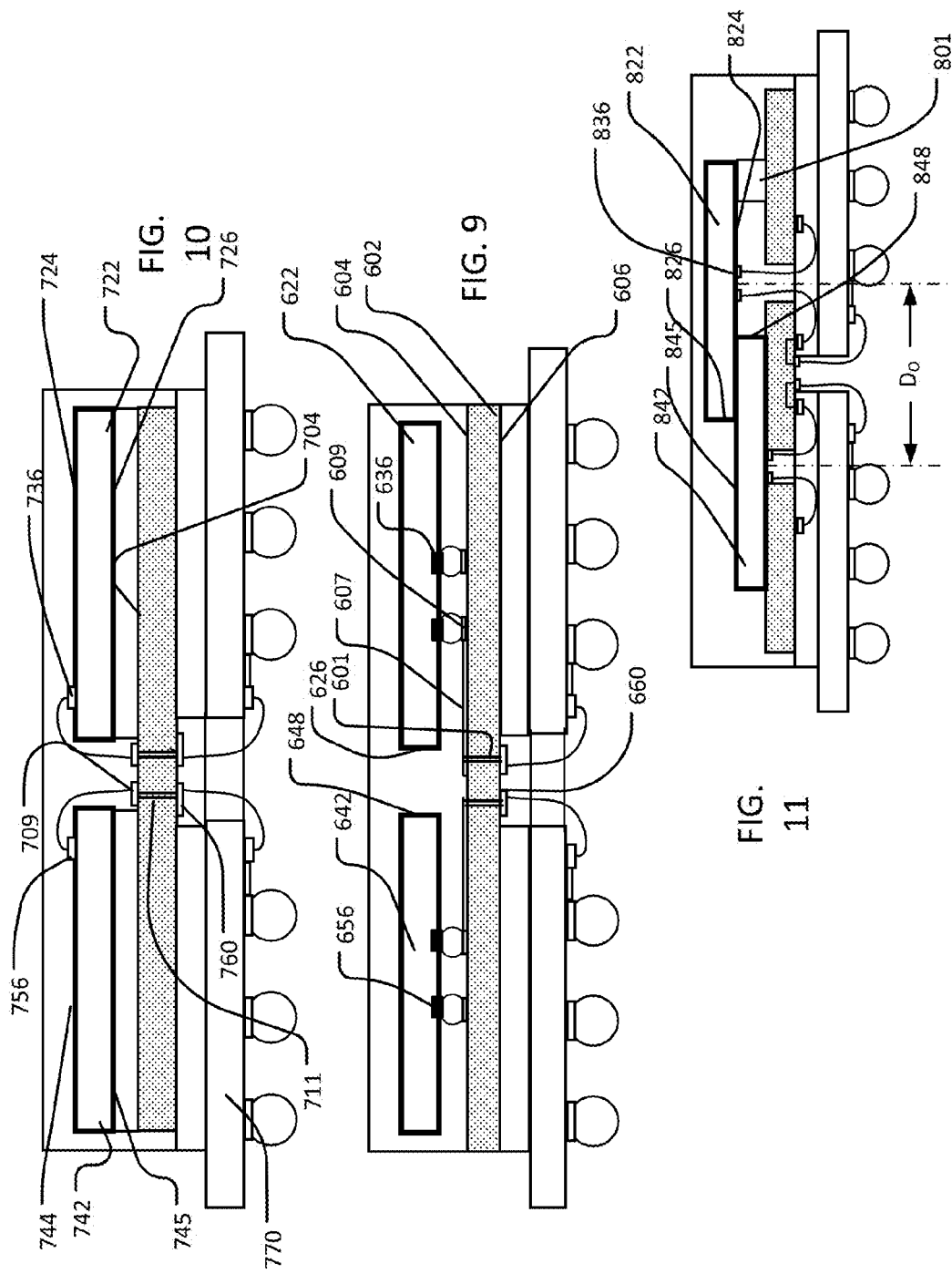

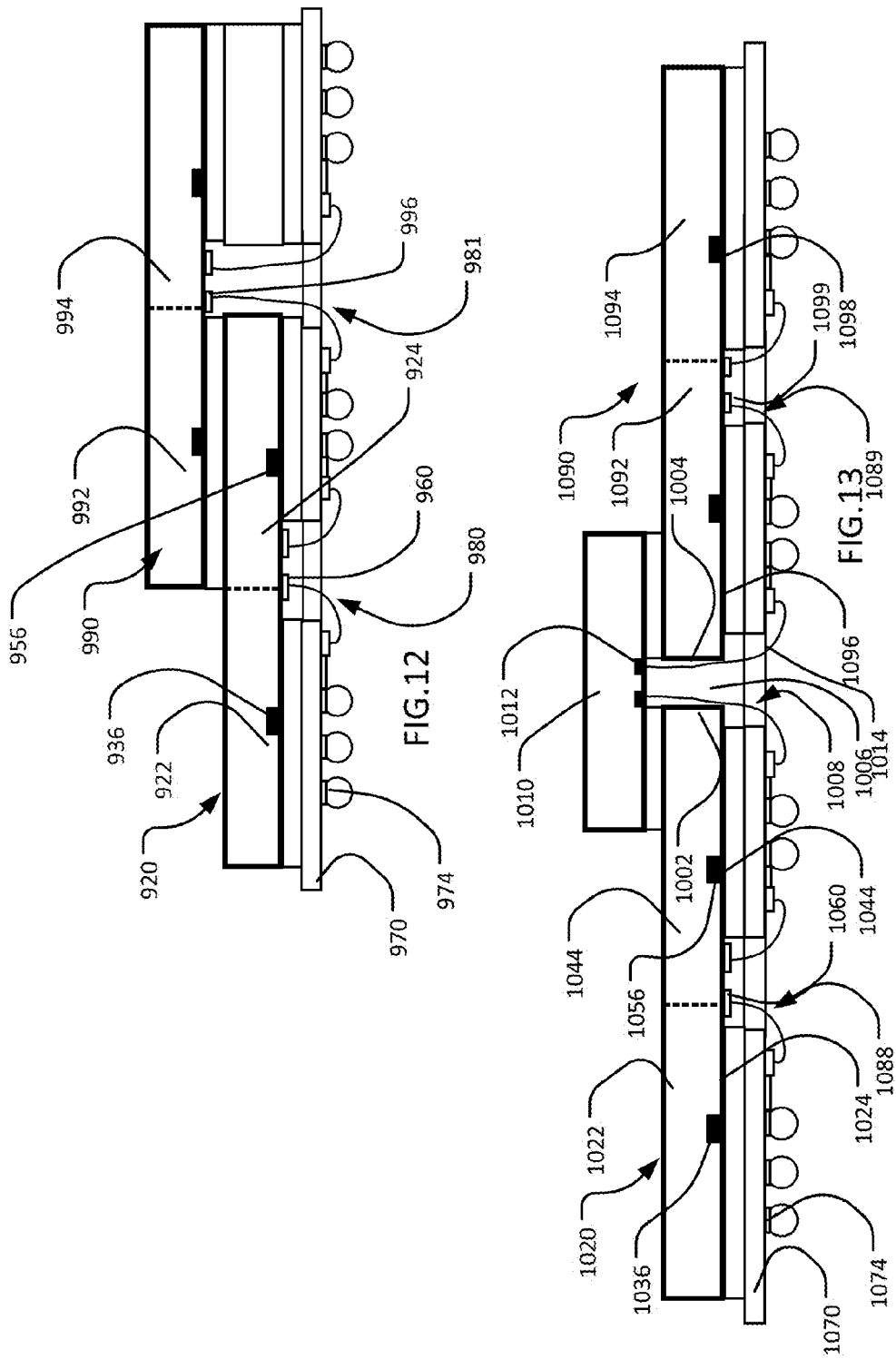

MICROELECTRONIC PACKAGE WITH CONSOLIDATED CHIP STRUCTURES

CROSS-REFERENCE TO RELATED APPLICATIONS

The present application is a continuation, of U.S. patent application Ser. No. 13/778,654, filed Feb. 27, 2013, now U.S. Pat. No. 9,123,600, the disclosure of which is incorporated herein by reference.

BACKGROUND OF THE INVENTION

The present invention relates to microelectronic packaging.

A typical semiconductor chip is formed as a generally thin, rectangular solid having front and rear major surfaces and small edge surfaces extending between the front and rear surfaces. The thickness or distance between the front and rear surfaces of the chip typically is many times smaller than the length and width of the chip measured in the plane of the front surface or rear surface. The chip typically has contacts on its front surface and electronic circuitry within the chip connected to the contacts. In use, the contacts are electrically connected to a larger circuit. Ordinarily, chips are manufactured by treating a larger, flat wafer to form the electronic circuitry and contacts of numerous chips simultaneously, and then severing the wafer along lines referred to as "dicing lanes" which form the edges or boundaries of the individual chips.

Chips typically are mounted in structures referred to as packages. A package may include a package substrate such as a small circuit panel having terminals thereon. The chip is physically attached to the package substrate, and the contacts of the chip are electrically connected to the terminals of the package substrate. The package substrate, with or without other components, provides physical protection for the chip. Moreover, the terminals of the package substrate are arranged so that the package as a whole can be readily mounted to a circuit panel or other structure to provide the interconnection between the chip and the larger circuit. For example, many chip packages have terminals that may be larger than the contacts of the chip, spaced apart from one another at larger intervals than the contacts of the chip, or both, so that the terminals can be soldered readily to conduct structures on a larger circuit panel using standard bonding techniques such as surface mounting. For example, the terminals on a chip package may be arranged in a pattern corresponding to a formal or informal industry standard such as those published by the JEDEC Solid State Technology Association.

Certain semiconductor chips are provided with their contacts disposed in one or more columns extending in a column direction along the front face of the chip. Typically, the column direction is parallel to two edges of the chip. For example, the column or columns of contacts may be disposed midway between the left and right edges of the chip and may be parallel to the edges of the chip. Memory chips such as dynamic random access memory ("DRAM") chips commonly are provided in this configuration. Chips of this type commonly are packaged using a package substrate having upper and lower surfaces, terminals at the lower surface, and an aperture in the form of an elongated slot extending through the substrate from the upper surface to the lower surface. The substrate may have bond pads at the lower surface adjacent the slot, the bond pads being electrically connected to the terminals by traces on the package substrate. The chip is mounted to the upper surface of the package substrate with the front face of the chip facing downwardly toward the package substrate and with the column or columns of contacts on the chip aligned with the slot in the package substrate. The contacts of the chip are connected to the bond pads of the package substrate by wire bonds extending through the slot in the package substrate, so that the contacts of the chip are electrically connected to the terminals of the package substrate. The wire bonds typically are covered by an encapsulant, which fills the slot. The terminals at the lower surface of the package substrate can be bonded to contact pads on a circuit panel so that the chip is interconnected with a larger circuit incorporated in the circuit panel.

Memory chips commonly are used in sets. For example, in a computer system that handles data in the form of eight-bit bytes and that uses a single error correction bit for each byte, the memory chips may be provided as sets of nine memory chips, so that a byte and the accompanying error correction bit can be stored and retrieved by storing or retrieving one bit to each of the nine chips. The chips of such a set may have many of their contacts connected on common. For example, the contacts that carry power supply voltages and ground can be connected in common, as well as the contacts that carry address and data signals to the various chips. Other contacts on each chip have unique connections to unique lines on the circuit panel. For example, signals referred to as "chip select" signals used to denote an individual chip of the set typically have unique connections on the circuit panel, so that a signal sent to a particular contact pad on the circuit panel is routed to only one chip of the set.

Various proposals have been advanced for mounting plural chips of this type in packages so that the plural chips can be connected to a circuit panel by attaching one package to the circuit panel. Such a package may have some of the contacts of each chip connected on common to terminals on the package substrate. This reduces the number of connections that must be made between the chip packages and the circuit board. For example, where two chips are provided in a single package, the total number of terminals on the package may be considerably less than twice the number of terminals that would be required on a single chip package. The terminals that can be connected in common to the two chips in the package need be provided only once. Moreover, the number of packages that must be handled and mounted to the circuit panel can be reduced by providing multiple chips within each package. For example, U.S. Pat. No. 7,061,121 and U.S. Published Patent Application No. 2012/0267798 disclose packages that can accommodate multiple chips such as memory chips. Nonetheless, further improvement would be desirable.

BRIEF SUMMARY OF THE INVENTION

One aspect of the present invention provides a microelectronic package. A package according to this aspect of the invention desirably includes a package substrate having upper and lower surfaces and terminals at the lower surface. The package desirably further includes first and second chips disposed above the package substrate. Each of the first and second chips preferably has a front face, a rear face, and contacts at the front face disposed in one or more columns extending in a column direction. The first and second chips most preferably are offset from one another by a center-to-center offset distance in a lateral direction transverse to the column direction. The package desirably further comprises interconnect pads disposed in an elongated interconnect zone having a width less than the offset distance. The interconnect pads desirably face downwardly toward the package substrate. At least some of the interconnect pads desirably are electrically connected to at least some of the contacts of the first and second chips, and at least some of the interconnect pads desirably are electrically connected to at least some of the terminals on the package substrate.

In certain embodiments, the first and second chips each have first and second edges extending in the column direction, and the front surfaces of the first and second chips are substantially coplanar with one another. The first edge of the first chip is juxtaposed with the second edge of the second chip, and the interconnect pads may be disposed adjacent the juxtaposed first and second edges. For example, the first and second chips may be integral with one another or may be separate from one another. The interconnect pads may be supported on the front surface of one or both of the first and second chips, and the front surfaces of the first and second chips may face downwardly toward the upper surface of the package substrate. The package may include redistribution traces extending from the interconnect pads toward the contacts of the first and second chips, and the interconnect pads may be electrically connected to the contacts of the first and second chips through the redistribution traces.

In other embodiments, the package further includes a redistribution interposer having an inner surface confronting the front surfaces of the first and second chips and an outer surface facing away from the first and second chips, and the interconnect pads are carried on the redistribution interposer.

In still other embodiments, the package includes a redistribution interposer having an inner surface confronting the rear surfaces of the first and second chips and an outer surface facing away from the chips. Once again, the interconnect pads may be carried on the redistribution interposer. The package may include additional chips. For example, the first and second chips may be disposed with their front surfaces substantially coplanar with one another as a first assemblage, and the package may include third and fourth chips having their respective front surfaces substantially coplanar with one another and constituting a second assemblage. The second assemblage may partially overlap the first assemblage, so that at least a portion of one surface of the third chip confronts at least a portion of one surface of the second chip and so that a portion of the second assemblage projects beyond the first assemblage in the lateral direction. The third and fourth chips desirably are electrically connected to at least some of the terminals on the package substrate. For example, the second assemblage may include additional connection pads aligned with the projecting portion of the second assemblage, at least some of the additional connection pads being connected to at least some of the contacts of the third and fourth chips and to at least some of terminals of the package substrate.

In yet another arrangement, the third and fourth chips are substantially coplanar with one another and with the first and second chips. The third and fourth chips may be aligned with the first and second chips respectively in the lateral direction, but offset from the first and second chips in the column direction. Conversely, the third and fourth chips may be aligned with the first and second chips in the column direction, but offset from the first and second chips in the lateral direction. For example, two of the first through fourth chips may be spaced apart from one another in the lateral direction, and the package may further comprise a fifth chip having a front surface and contacts at the front surface. The front surface of the fifth chip may confront portions of the rear surfaces of the two spaced-apart chips, and the contacts of the fifth chip may be aligned with the gap and connected to the package substrate through the gap.

Yet another aspect of the invention provides a microelectronic unit. A unit according to this aspect of the invention includes a first assemblage including first and second chips mechanically connected to one another. Here again, the first and second chips may be integral with one another or may be separate from one another, in which case the unit desirably further comprises an attachment securing the first and second chips to one another. Here again, each chip desirably has a front surface, a rear surface, and first and second edges extending in an edge direction and bounding the front surface of the chip, as well as contacts at the front surface. The chips desirably are disposed side-by-side with the front surfaces of the first and second chips, substantially coplanar with one another, and the first edge of the first chip juxtaposed with the second edge of the second chip. Thus, the assemblage has a front surface defined at least in part by the front surfaces of the first and second chips. The unit according to this aspect of the invention includes interconnect pads carried on the front surface of the assemblage. At least some of the interconnect pads are electrically connected to at least some of the contacts of the first chip, and at least some of the interconnect pads are electrically connected to at least some of the contacts of the second chip. Preferably, the interconnect pads include one or more common interconnect pads, each such common interconnect pad being connected to at least one contact of the first chip and to at least one contact of the second chip. The first and second chips may be offset from one another by a center-to-center offset distance in a lateral direction transverse to the edge direction, and the interconnect pads may be disposed in an elongated interconnect zone having a width less than the offset distance. Units according to this aspect of the invention may be used, for example, as components in the packages discussed above.

These and other objects, features, and advantages of the present invention will be more readily apparent from the detailed description of the preferred embodiments set forth below, taken in conjunction with the accompanying drawings.

BRIEF DESCRIPTION OF THE DRAWINGS

FIG. 1 is a diagrammatic plan view of a unit according to one embodiment of the invention.

FIG. 2 is a diagrammatic sectional view of a package incorporating the unit of FIG. 1.

FIG. 3 is a diagrammatic plan view of a unit according to a further embodiment of the invention.

FIG. 4 is a view similar to FIG. 3, but depicting a unit according to yet another embodiment of the invention.

FIG. 5 is a diagrammatic sectional view of the unit depicted in FIG. 4.

FIG. 6 is a further view similar to FIGS. 3 and 4, but depicting a unit according to yet another embodiment of the invention.

FIGS. 7-14 are diagrammatic sectional views depicting packages according to still further embodiments of the invention.

DETAILED DESCRIPTION

Figure 14:
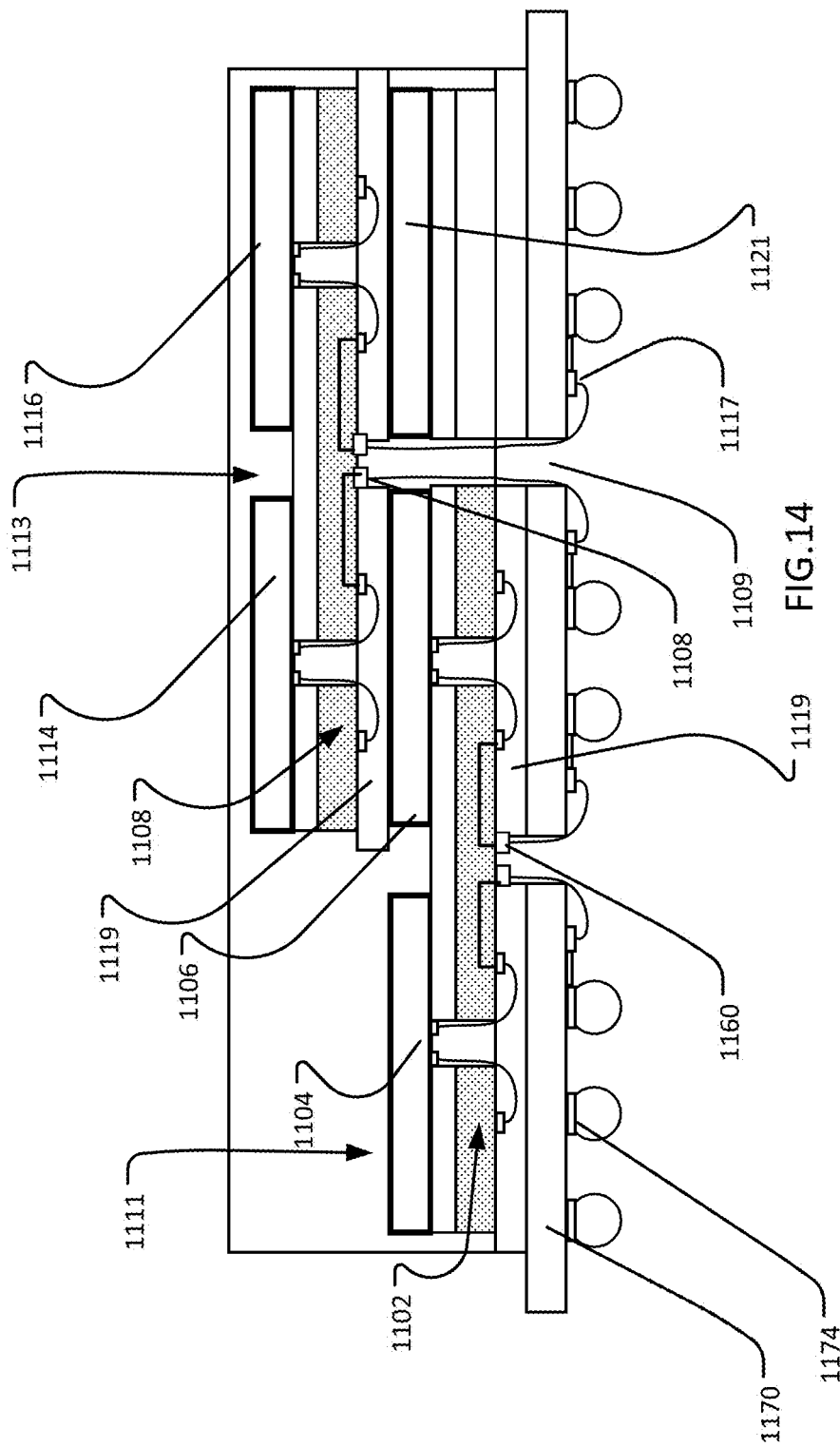

A unit 20 according to one embodiment of the invention (FIG. 1) includes a first semiconductor chip 22 having a front surface 24 and a rear surface 26. Chip 22 has a first or left edge 26 and an opposite second or right edge 28, the edges 26 and 28 extending parallel to one another in an edge or column direction denoted by the arrow Y in FIG. 1. Chip 22 also has ends 30 and 34 extending in a lateral direction, transverse to the edge direction, as denoted by arrow X in FIG. 1, so that the edges 26 and 28 and ends 30 and 34 cooperatively bound the front and rear surfaces 24 and 26 of the chip. First chip 22 also has contacts 36 at front surface 24. As used in this disclosure with reference to a structure such as a chip or substrate, a statement that an electrically conductive element is "at" a surface of a structure indicates that, when the structure is not assembled with any other element, the electrically conductive element is available for contact with a theoretical point moving in a direction perpendicular to the surface of the structure toward the surface of the structure from outside the structure. Thus, a terminal, contact or other conductive element which is at a surface of a structure may project from such surface; may be flush with such surface; or may be recessed relative to such surface in a hole or depression in the structure.

Contacts 36 are arranged in a column or columns, each such column extending in a column direction parallel to the edge direction Y. Chip 22 also has internal circuit elements 38, schematically depicted in FIG. 1, the internal circuit elements being connected to the contacts 36. Although only a few contacts and a few internal circuit elements 38 are depicted in FIG. 1, a typical chip may have scores or hundreds of contacts and may have a vast number of internal circuit elements. The configuration of the internal circuit elements is determined by the function of the chip. For example, the chip may be a memory chip, such as a DRAM chip, and may have elements such as storage cells and input/output circuits arranged to receive signals such as address and data signals, as well as power and ground signals and other control signals, so that data can be written into the storage cells and read out from the storage cells in known fashion. As used in this disclosure, the term "memory chip" refers to a chip in which at least 50% of the area of the chip devoted to active circuit elements is devoted to active circuit elements associated with the memory function.

Unit 20 also includes a second semiconductor chip 42 having a front surface 44 and a rear surface 45 (FIG. 2), and also having a first edge 46 and second edge 48 extending in the edge or Y-direction and ends 50 and 54 extending in the lateral or X-direction. Here again, the second chip has contacts 56 at the front surface 44 and internal circuitry 58 electrically connected to the contacts. The second chip may be essentially identical to the first chip. As best seen in FIG. 2, the front surfaces 24 and 44 of chips 22 and 42 are coplanar with one another, and the rear surfaces 26 and 45 of the two chips are also coplanar with one another. The first edge 26 of the first chip is juxtaposed with the second edge 48 of the second chip 42. In the embodiment depicted, the two chips 24 and 44 are formed as a unitary body of semiconductor material such as silicon. The first edge 42 of the second chip, the second edge 28 of the first chip, and the ends 30, 34, 50, and 54 of the first and second chips are visible as small, generally planar surfaces extending in a vertical direction between the front and rear surfaces of the chip.

The first edge 26 of the first chip and the second edge 48 of the second chip are adjacent to one another. A narrow strip 49 of semiconductor material, referred to as a "dicing lane" lies between the first edge 26 of the first chip and the second edge 48 of the second chip. Although the edges 26 and 48 the chips bounding the dicing lane 49 may not be visible as surfaces, the edges are nonetheless present. These edges are the boundaries of the respective chips at the dicing lane between the chips. As noted above, chips are ordinarily formed by processing continuous wafers and dicing or cutting the chips away from one another along dicing lanes. A dicing lane is a linear region of the silicon wafer that is devoid of internal interconnections within the semiconductor material of the chip itself which are used in service during normal operation of the chip. Features such as test circuits may be present in dicing lanes. These elements may be present in the unit or, alternatively, may be destroyed during processing of the wafer. Stated another way, as used in this disclosure, a chip has an edge at a dicing lane, whether or not the chip has been severed from other chips during dicing of the wafer.

The term "free edge" or "free end" is used herein to denote an edge or an end of a chip that has been severed from the edges or ends of adjacent chips in the wafer during manufacture, whereas the term "bound edge" or "bound end" is used to denote an edge or an end of a chip that remains attached to the adjacent chip of the wafer. In the embodiment of FIGS. 1 and 2, the first edge 26 of first chip 22 and the second edge 48 of second chip 42 are bound edges, whereas the second edge 28 of first chip 22 and the first edge 46 of second chip 42 are free edges and ends 30, 34, 50, and 54 are free ends.

The two chips 22 and 42 cooperatively form an assemblage having a front surface consisting of the front surfaces 24 and 44 of the two chips. The chips in the assemblage are offset from one another by a center-to-center offset distance $D_o$ (FIG. 1). The center-to-center offset distance is the distance between the center lines of the two chips. In this embodiment, $D_o$ is equal to the width in the lateral direction of a single chip plus the width of the dicing lane 49. The width of the dicing lane is much smaller than the width of a chip, and thus $D_o$ is approximately equal to the width of a single chip.

Unit 20 further includes interconnect pads 60 carried on the front surface of the assemblage. In this embodiment, the interconnect pads are carried on the front surface 24 of first chip 22. The interconnect pads are disposed in a narrow elongated interconnect zone 62, schematically indicated by the dot-line in FIG. 1. The width $D_r$ of interconnect zone 62 in the lateral or X-direction is considerably less than the offset distance than $D_o$ and most desirably is less than a few millimeters, more preferably less than 1 millimeter. As shown in FIG. 1, interconnect pads 60 are disposed in two rows extending in the edge or column direction, parallel to the rows of contacts 36 and 56. The interconnect pads 60 are electrically connected to the contacts 36 and 56 of chips 22 and 42 by redistribution traces 64. Some of the interconnect pads 60 are common interconnect pads 60a. Each common interconnect pad 60a is connected to at least one contact 36 of the first chip and is also connected to at least one contact 56 of the second chip. Other interconnect pads 60 are unique interconnect pads 60b. A unique interconnect pad 60b may be connected to one or more contacts 36 of the first chip but not connected to any contact of the second chip. Alternatively, a unique interconnect pad may be connected to one or more contacts 56 of the second chip, but not connected to any contacts of the first chip.

The interconnect pads 60 and redistribution traces 64 may be disposed directly on the front surfaces of the chips or may rest on a thin layer or coating of dielectric material, which overlies and is supported by the front surfaces of the chips. As best seen with reference to FIG. 2, the redistribution traces 64 may be covered by a thin dielectric layer. The interconnect pads, redistribution traces and the associated dielectric layers may be formed using conventional processes such as the application of "spun-on" dielectric layers and conventional metal-forming techniques such as electroplating and selective etching. The interconnect pads and redistribution traces may be formed while the chips are part of a larger wafer, i.e., before severance of the free edges and ends of the chips from the other chips in the wafer.

As best seen in FIG. 2, a package incorporating unit 20 incorporates a package substrate 70 having an upper surface 72, a lower surface 74, and terminals 76 at the lower surface 74. Package substrate 70 may be a small rigid or flexible circuit panel. Terminals 76 are arranged for connection to a larger circuit as, for example, for mounting to a larger circuit panel. In the embodiment depicted, terminals 76 are constructed as solderable pads, which can be surface-mounted to a circuit board (not shown). Solder masses 78 may be provided on terminals 76 for this purpose. Package substrate 70 has an aperture 80 extending through it, from upper surface 72 to lower surface 76. Aperture 80 is in the form of an elongated slot. Bond pads 82 are provided at bottom surface 74 adjacent the aperture. The bond pads 82 are electrically connected to the terminals 76 by conductors 84, only a few of which are shown for clarity of illustration.

Unit 20 is mounted on package substrate 70 with the front surface of the chip assemblage, defined by the front surfaces 24 and 44 of the chips, facing downwardly toward the upper surface 72 of the package substrate, and with the interconnect zone 62 of the unit (FIG. 1) aligned with the aperture or slot 80 in the package substrate, so that the interconnect pads 60 are also aligned with the aperture or slot 80. An adhesive 86 may bond the unit to the package substrate. For example, as depicted in FIG. 2, the adhesive 86 may contact the dielectric layers 66 covering the redistribution traces 64. Interconnect pads 60 are connected to the bond pads 82 by leads such as wire bonds 88 extending from the interconnect pads through the aperture 80. Thus, the interconnect pads and hence the contacts of the chips are electrically connected to terminals 76 of the package substrate. An encapsulant (not shown) may be provided within slot 80 and on adjacent areas of the package substrate lower surface 74 so as to cover the wire bonds 88. Also, an encapsulant (not shown) may be provided over the upper surface 72 of the package substrate, over the exposed edges and ends of the chip, and over the exposed rear surfaces 26 and 44 of the chips.

The package and unit as described above simplifies connection of the chips to the terminals. The number of wire bonds required to connect unit 20 to the terminals of the package substrate it considerably less than the number of wire bonds that would be required if each individual contact on both of the chips was connected to the features of the package substrate. Also, because all of the wire bonds can be made in a single relatively narrow area, only one aperture is required in the package substrate. This considerably simplifies routing on the package substrate and leaves more room for terminals on the lower surface of the package substrate.

A unit 120 (FIG. 3) according to a further embodiment is identical to the unit depicted in FIG. 1, except that the first chip 122 and second chip 142 forming the unit are separate from one another rather than integral with one another. Stated another way, the first edge 126 of first chip 122 and the second edge 148 of second chip 142 are free edges rather than bound edges. Here again, the chips are disposed in the same side-by-side relationship as in the unit of FIG. 1, with the front surfaces of the chips being coplanar with one another and with the first edge 126 of the first chip juxtaposed with the second edge 148 of the second chip. The chips are secured to one another by an attachment in the form of an encapsulant or molding compound 102 extending around the edges and ends of the chips and extending between the first edge 126 of the first chip and the second edge 148 of the second chip. The molding compound or encapsulant defines a surface flush with the front surfaces 124 and 144 of the second chip. Here again, the unit has a front surface defined in part by the chip front surfaces 124 and 144 and in part by the surface of the attachment or molding compound 102. Here again, the interconnect pads 160 are disposed in a relatively narrow, elongated interconnect zone 162 disposed adjacent the juxtaposed edges 126 and 148 of the chips. Here again, the interconnect pads 160 and the redistribution traces 164 overlie the front surface of the assemblage. However, the interconnect zone 162 may be shifted so that some or all of the interconnect pads overlie the molding compound between the chip edges 126 and 148, or so that some of the interconnect pads are distributed on each chip. A unit as shown in FIG. 3 may be used in place of the unit 20 discussed above in the assembly of FIG. 2 and in other assemblies discussed below.

A unit 220 (FIGS. 4 and 5) according to a further embodiment includes a first chip 222 and second chip 242 identical to those discussed above with reference to FIGS. 1 and 2. Here again, the unit includes interconnect pads 260 disposed in an elongated narrow interconnect zone 262. In this instance, however, the interconnect pads are disposed on a small dielectric layer 202 overlying and supported by the front surfaces 224 and 244 of the chips. The dielectric layer also has redistribution bond pads 204. The redistribution bond pads 204 are connected by redistribution traces 264 to the interconnect pads 260. One row of redistribution bond pads 204 lies adjacent the contacts 236 of the first chip 222, whereas another row of redistribution bond pads is positioned adjacent the contacts 256 of the second chip 244. Wire bonds 206 connect the contacts 236 and 256 with the redistribution bond pads, so that the redistribution bond pads, and hence the redistribution pads 260, are electrically connected to the contacts of the chip. Here again, the interconnect pads 260 include some unique interconnect pads that are connected only to a contact or contacts of the first chip or only to a contact or contacts of the second chip, and also include some common interconnect pads that are connected to contacts of both chips by redistribution traces, redistribution bond pads, and wire bonds as discussed above.

A unit 320 according to a further embodiment (FIG. 6) includes an arrangement of interconnect pads 360, dielectric layer 302, redistribution traces 364, redistribution bond pads 304, and wire bonds 306 connecting the redistribution bond pads to the contacts of the chips in the same manner as the corresponding features of FIGS. 4 and 5 discussed above. However, in this embodiment, the two chips are separate from one another, and an attachment or molding compound 301 holds the two chips together. This attachment may be similar to the attachment discussed above with reference to FIG. 3.

A package according to a further embodiment of the invention (FIG. 7) incorporates a first chip 422 and second chip 442 similar to those discussed above. Here again, the two chips are arranged side-by-side, with the first or left-hand edge 426 of first chip 422 juxtaposed with the second or right-hand edge 448 of the second chip 442, and with the front surfaces 424 and 444 of the chips substantially coplanar with one another. In this embodiment, the first chip includes two columns of contacts 436 at its front surface, whereas the second chip incorporates two similar columns of contacts 456 at its front surface. The columns are depicted in end view as seen in FIG. 7, and extend in the column or edge direction, parallel to edges 426 and 448 of the chips, into and out of the plane of the drawing as seen in FIG. 7. Chips 422 and 442 are mounted to a redistribution interposer 402 having an inner surface 404 facing toward the chips and an outer surface 406 facing away from the chips. The redistribution interposer may be a small circuit panel, such as a flexible or rigid printed circuit panel.

The chips may be secured to the redistribution interposer by a layer of adhesive 408. The redistribution interposer has openings 410 in the form of elongated slots aligned with the rows of contacts 436 and has redistribution bond pads 412 at outer surface 406, adjacent apertures 410. The redistribution substrate also has interconnect pads 460 at its outer surface 406. The interconnect pads 460 are electrically connected to the redistribution bond pads 412 by conductors 414, a few of which are schematically shown in FIG. 7. The contacts 436 and 456 are connected to the redistribution bond pads 412 by wire bonds extending through aperture 410, so that that the contacts are electrically connected to the interconnect pads 460. An encapsulant 416 may be provided on the outer surface 406 of the redistribution interposer to protect the wire bonds.

The redistribution substrate, with chips 422 and 442 carried thereon, is mounted above the package substrate 470 so that the outer surface 406 of the redistribution substrate, and hence the interconnect pads 460, face downwardly toward the package substrate. In this embodiment as well, package substrate 470 has an aperture 480. In the same manner as discussed above with reference to FIG. 1, the interconnect pads 460 are connected to bond pads 482 on the redistribution substrate by wire bonds 488 extending through aperture 480 and thus electrically connected to terminals 476 at the lower surface of package substrate 470. Additional encapsulants (not shown) may be provided over wire bonds 488 and over the chips and redistribution interposer for mechanical protection.

A package according to yet another embodiment of the invention (FIG. 8) is similar to the package of FIG. 7, except that the interconnect pads 560 are exposed through holes 503 in the redistribution interposer, so that the redistribution pads 560 are accessible from the inner surface 504 of the redistribution interposer 502. Stated another way, redistribution pads 560 are at the inner surface 504, i.e., the side of the redistribution interposer facing toward the chips. The redistribution interposer 502 and chips 522, 542 are mounted to package substrate 570 so that the inner surface 504 of the redistribution interposer faces downwardly toward the package substrate, and thus the surfaces of redistribution pads 560 facing toward holes 503 also face downwardly toward the package substrate. Here again, the interconnect pads are connected to the terminals 570 of the package substrate by means of wire bonds extending through the aperture in the package substrate and connected to bond pads on the package substrate. Here again, additional encapsulants may be provided over the wire bonds and over other components for mechanical protection.

The package of FIG. 9 is similar to the package of FIG. 7, discussed above, except that the redistribution substrate 602 of FIG. 9 does not have apertures. Rather, via conductors 601 provided within the package substrate extend between the inner surface 602 and outer surface 606 of the package substrate. The interconnect pads 660 are connected by the via conductors to redistribution traces 607, which, in turn, are connected to pads 609 at the inner surface 604 of the redistribution interposer. The contacts 636 and 656 of chips 622 and 642 are bonded to pads 609 as, for example, by solder-bonding, so that the contacts of the chips are again electrically connected to the interconnect pads 660. In this embodiment as well, the interconnect pads face downwardly toward the package substrate and are electrically connected to the terminals of the package substrate. In this embodiment as well, the interconnect pads 660 are disposed in a relatively narrow interconnect zone adjacent the juxtaposed edges 648, 626 of the chips.

The embodiment of FIG. 10 is similar to the embodiment of FIG. 9, except that the chips 722, 742 are mounted with the rear surfaces 726 and 745 of chips 722 and 742 facing toward the inner surface 704 of the redistribution interposer and with the front surfaces 724, 744 facing upwardly, away from the redistribution interposer. The contacts 736, 756 of the chips are connected by wire bonds to pads 709 on the inner surface of the redistribution interposer, which, in turn, are electrically connected to the interconnect pads 760 by via conductors 711. Here again, the interconnect pads face downwardly toward the package substrate.

The embodiment of FIG. 11 is similar to the embodiment discussed above with reference to FIG. 7, except that in the embodiment of FIG. 11, the chips are not disposed in the side-to-side, coplanar arrangement discussed above. In the embodiment of FIG. 11, the first chip 822 partially overlaps the second chip. Thus, the first edge 826 and the adjacent portion of the front surface 824 of first chip 822 overlap the rear surface 845 of the second chip 842. The columns of contacts 836 and adjacent portions of the first chip front surface 824 project in the lateral direction beyond the second edge 848 of the second chip. Stated another way, the center-to-center offset distance $D_o$ between the first and second chips is less than the width of a single chip. This staggered arrangement thus conserves space in the lateral direction. A spacer 801 may be provided between the first chip 822 and the redistribution substrate to support the first chip in the region remote from the second chip 842. The staggered arrangement can be used in conjunction with the other embodiments discussed herein, in place of the side-by-side, coplanar arrangement discussed above.

The package shown in FIG. 12 includes two units, each of which is similar to the unit 20 discussed above with reference to FIGS. 1 and 2. Thus, the first unit 920 includes a first chip 922 and a second chip 924 disposed in a coplanar arrangement such as that discussed above with reference to FIGS. 1 and 2, with the front surfaces of the chips 922 and 924 (the downwardly facing surfaces in FIG. 12) being substantially coplanar with one another. Unit 920 further includes interconnect pads 960 similar to those discussed above with reference to FIG. 1, which are connected to the contacts 936 and 956 of chips 924 and 922 by redistribution traces (not shown) in the same way as discussed above with reference to FIG. 1. The package of FIG. 12 further includes a second unit 990, which includes a third chip 992 and fourth chip 994, as well as interconnect pads 996 connected to the contacts of these chips. These units are stacked in a staggered configuration similar to the stacked configuration of the chips discussed above with reference to FIG. 11. Thus, at least a portion of the front surface of third chip 992 overlaps at least a portion of the rear surface of second chip 924. Here again, the interconnect pads 960 and 996 of the units face downwardly toward the package substrate 970. The package substrate has terminals 974, which are connected to the interconnect pads 960 and 996 by wire bond arrangements extending through apertures 980 and 981 in the package substrate.

A package according to another embodiment of the invention (FIG. 13) also includes two units 1020 and 1090, similar to the unit 20 discussed above with reference to FIGS. 1 and 2. Unit 1020 includes a first chip 1022 and second chip 1024 disposed in coplanar arrangement with one another, with the front surfaces of the first and second chips coplanar with one another. Here again, the unit includes interconnect pads carried on the front surface of the unit and connected to the contacts 1036 and 1056 of chips 1024 and 1044. The second unit 1090 includes a third chip 1092 and fourth chip 1094 having their front surfaces 1096 and 1098 coplanar with one another, and again being arranged in a side-by-side relationship as discussed above with reference to FIGS. 1 and 2. The second unit also includes interconnect pads 1099, connected to the contacts of the third and fourth chips 1092 and 1094. Units 1020 and 1090, in turn, are arranged side-by-side with one another so that the front surfaces 1024, 1044, 1096, and 1098 of all of the first through fourth chips are substantially coplanar with one another. In this arrangement, the chips are aligned in the column direction (the direction into and out of the plane of the drawing in FIG. 13). Thus, an edge 1002 of second chip 1024 is juxtaposed with an edge 1004 of third chip 1092. However, these edges do not abut one another. Instead, there is a gap 1006 between the juxtaposed edges of the second and third chips. Units 1020 and 1090 are carried on a package substrate 1070. Here again, the interconnect pads 1060 and 1099 of both units face downwardly toward the package substrate. The interconnect pads are electrically connected to the terminals 1074 on the package substrate. In the particular embodiment depicted, this connection is made using wire bonds extending through apertures 1088, 1089 in the package substrate, in a manner similar to that discussed above with reference to FIGS. 1 and 2. The gap 1006 between the juxtaposed edges of the second and third chips is aligned with a further aperture 1008 in the package substrate. A fifth chip 1010 is mounted to the rear or upwardly facing surfaces of the second and third chips 1024, 1092 so that contacts 1012 of the fifth chip are aligned with the gap 1006 between the second chip 1024 and the third chip 1092 and also aligned with aperture 1008 in the package substrate. The fifth chip is connected to the terminals of the package substrate by conductors passing through gap 1006. In the particular embodiment shown, these conductors include wire bonds 1014 extending from the contacts 1012 of fifth chip 1010 to bond pads on the package substrate, which, in turn, are electrically connected to at least some of the terminals 1074 of the package substrate. A package according to this embodiment is particularly well suited for applications where chips are used in sets incorporating an odd number of chips as, for example, the five chips shown. As mentioned above, odd numbers of chips commonly are employed in arrays of memory chips as, for example, where four chips are used to store four information bits and the fifth chip is used to store error correction bits.

The package of FIG. 14 includes a first assemblage 1111, which incorporates a redistribution interposer 1102, a first chip 1104, and a second chip 1106. These elements are connected in the same manner as the redistribution interposer 402, discussed above with reference to FIG. 7 and the associated chips, so that the contacts of chips 1104 and 1106 are electrically connected to the interconnect pads 1160 of the redistribution interposer 1102. The redistribution interposer 1102 is mounted to package substrate 1170, and the interconnect pads 1160 are electrically connected to at least some of the terminals 1174 of the package substrate in the same manner as discussed above with reference to FIG. 7. The package of FIG. 13 further includes a second assemblage 1113 incorporating a further redistribution interposer 1108, bearing a third chip 1114, and fourth chip 1116. Chips 1114 and 1116 are electrically connected to the interconnect pads 1118 of the second redistribution interposer 1108 in the same manner as the chips of the first assemblage. The two assemblages are mounted in a staggered arrangement similar to the arrangement of FIG. 12, so that a portion of the second redistribution interposer overlies the upwardly facing or rear surface of the second chip 1106. The interconnect pads 1108 of the second redistribution interposer project laterally beyond the second chip 1106 of the first assemblage 1111. Interconnect pads 1108 are aligned with an aperture 1109 in the package substrate and electrically connected to bond pads 1117 of the package substrate by wire bonds extending through this aperture 1109. In this embodiment as well, layers of encapsulant 1119 cover the wire bonds that connect the various chips to the various redistribution interposers, so that each assemblage can rest on the package substrate or on the next lower assemblage without damaging these wire bonds. A dummy chip 1121 may be provided beneath the projecting portion of the second redistribution interposer 1108, so as to physically support this projecting portion. In a further alternative, dummy chip 1121 may be an active semiconductor chip that is also connected to at least some of the terminals 1174 of the package substrate.

Figure 15:
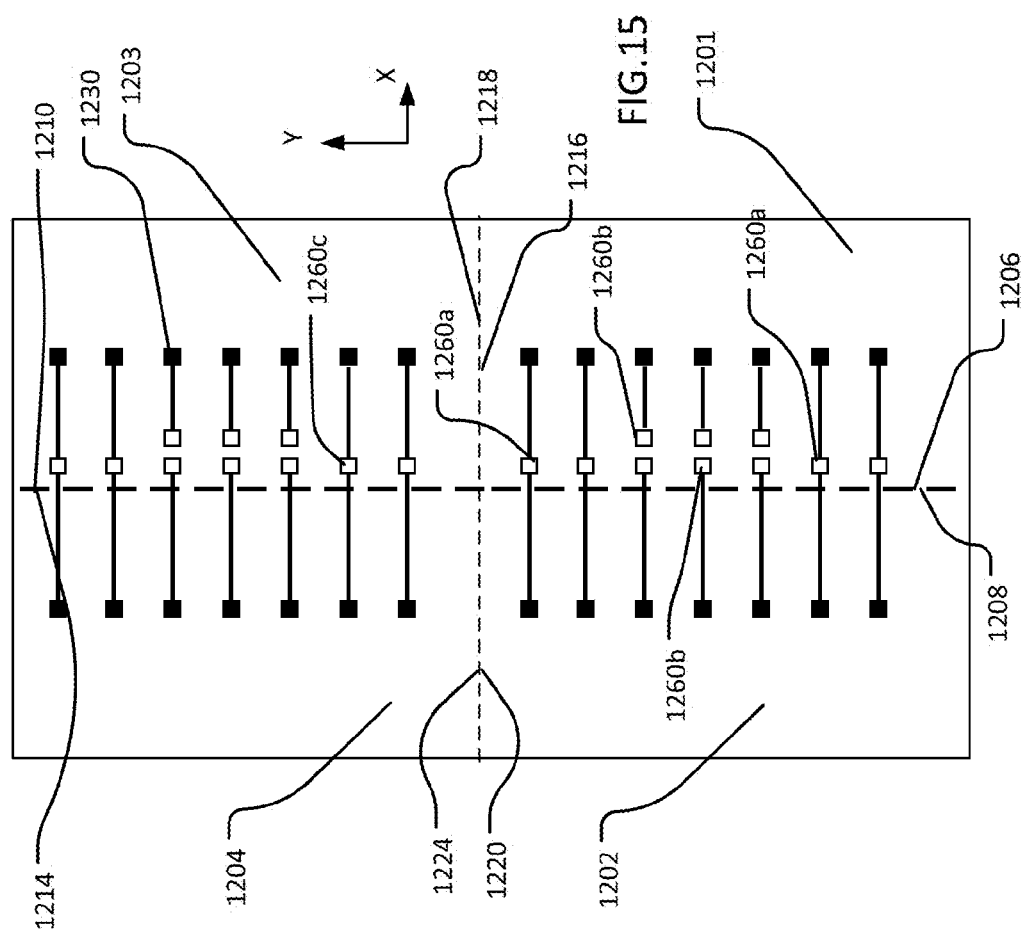
FIG. 15 is a diagrammatic top view depicting a unit according to yet another embodiment of the invention.

A unit or assemblage of chips according to yet another embodiment of the invention (FIG. 15) includes four chips, all of which have front surfaces (the surfaces depicted in FIG. 14) substantially coplanar with one another. Chips 1201 and 1202 have edges 1206 and 1208 juxtaposed with one another. Likewise, chips 1204 and 1203 have edges 1210 and 1214 juxtaposed with one another. Here again, each chip has one or more rows of contacts 1230 extending in a column direction or edge direction, parallel to the edges of the chips. In this embodiment, the first chip 1201 is aligned with the third chip 1203 in the lateral direction, transverse to the edge or column direction, whereas the fourth chip 1204 is aligned with the second chip 1202 in the lateral direction. Thus, the first and third chips have ends 1216 and 1218 juxtaposed with one another, whereas the second and fourth chips have ends 1220 and 1224 juxtaposed with one another. In the particular embodiment depicted, the juxtaposed edges and ends are bound edges and ends. That is, all four chips are integral with one another. Dicing lanes (not shown) extend between the bound edges and ends. In a further variant (not shown), some or all of the juxtaposed edges and ends may be free edges or free ends, and the chips may be held together by a molding compound or attachment similar to the arrangement shown in FIG. 3. Here again, the unit includes interconnect pads 1260 disposed in a narrow, elongated interconnect zone. The interconnect pads 1260 include some common interconnect pads 1260a, which are connected to contacts of the first chip and to contacts of the second chip, and also include some unique interconnect pads 1260b, which are connected to contacts of only one chip. The interconnect pads also include some common interconnect pads 1260c, which are connected to contacts of the third chip 1203 and fourth chip 1204, as well as unique contacts connected to only one of the chips. In a further variant, some or all of the common interconnect pads may be connected to all four of the chips, so as to further reduce the numbers of contact pads required. Units according to this variant may be used to provide increased capacity.

In further variants, a gap may be provided between the end 1216 of the first chip and the end 1218 of the third chip, as well as between the end 1220 of the second chip and the end 1224 of the fourth chip. In such an arrangement, a fifth chip may have contacts aligned with the gap in a manner similar to that discussed above with reference to FIG. 13.

Figure 16:
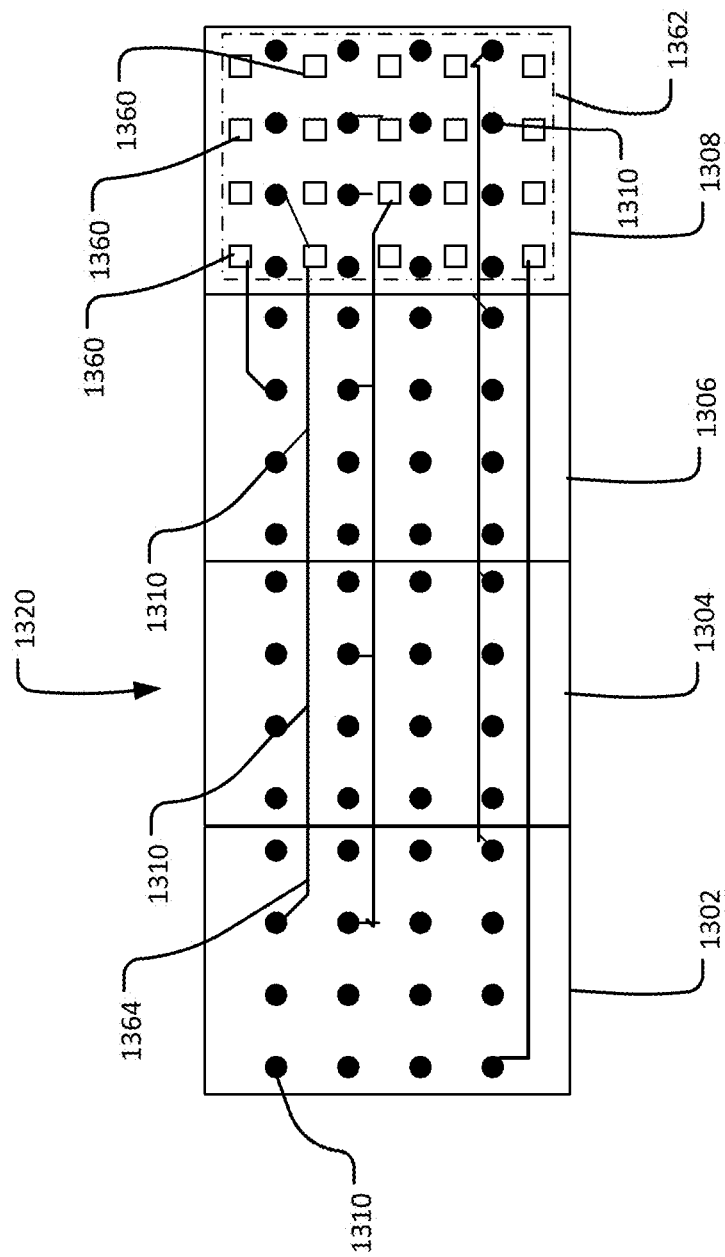
FIG. 16 is a diagrammatic top view depicting a unit according to a still further embodiment of the invention.

Units incorporating multiple chips such as those discussed above with reference to FIGS. 1, 3, and 14 may incorporate numerous chips. Also, it is not essential that the interconnect pads be disposed in a narrow interconnect zone or in the region between rows of chip contacts or adjacent particular chips. Merely by way of example, the unit 1320 depicted in FIG. 16 has four chips 1302, 1304, 1306, and 1308 disposed side-by-side, with the front surfaces (the surfaces depicted in FIG. 15) coplanar with one another. Each chip has an array of contacts 1310. Interconnect pads 1360 are provided within an interconnect zone 1362. The interconnect zone overlies less than all of the chips; in the particular embodiment shown, the interconnect zone is disposed entirely within the confines of the fourth chip 1308. In other embodiments, the interconnect zone may encompass portions or all of the front surface of two or more chips. Also, the interconnect zone may or may not encompass some of the contacts on one or more of the chips, so that both contacts and interconnect pads may be present within the interconnect zone. Here again, the contacts 1310 of the various chips are electrically connected to the interconnect pads 1360 by redistribution traces 1364, extending over the front faces of the chips. Because the interconnect zone encompasses less than all of the chips, some or all of the interconnect traces cross edges of the chips, so that an interconnect trace may start at a contact 1310 on one chip and end at an interconnect pad 1360 overlying another chip. By concentrating the electrical connections for the various chips into an interconnect zone 1362, having a surface area considerably less than the aggregate surface of all of the chips, this arrangement makes it practical to connect the multi-chip unit to a circuit panel or other structure that has mating electrical features on only a relatively small area.

Numerous variations and combinations of the features discussed above can be utilized without departing from the present invention. Merely by way of example, the features set forth in the individual embodiments can be combined with one another. For example, a soldered connection as shown in FIG. 9 can be used to connect chips to a redistribution interposer, as shown in FIG. 9, in any of the various embodiments and also can be used to connect the interconnect pads of a unit or redistribution interposer to appropriate mating connections on a package substrate.

As these and numerous other variations and combinations of the features discussed above can be utilized without departing from the present invention, the foregoing description of the preferred embodiments should be taken by way of illustration, rather than by way of limitation, of the invention as defined by the claims.

The invention claimed is:

1. A microelectronic package comprising:
   (a) a package substrate having upper and lower surfaces and terminals at the lower surface;
   (b) first and second chips disposed above the package substrate, each of the first and second chips having a front face, a rear face and contacts at the front face disposed in one or more columns extending in a column direction, the first and second chips being offset from one another by a center-to-center offset distance in a lateral direction transverse to the column direction;
   (c) interconnect pads disposed in an elongated interconnect zone having a width less than the offset distance, the interconnect pads facing toward the package substrate at least some of the interconnect pads being electrically connected to at least some of the contacts of the first and second chips, at least some of the interconnect pads being electrically connected to at least some of the terminals of the package substrate
   wherein each of the first and second chips has first and second edges extending in the column direction and the front surfaces of the first and second chips are substantially coplanar with one another, the first edge of the first chip being juxtaposed with the second edge of the second chip, the interconnect pads being disposed adjacent the juxtaposed first and second edges,
   the microelectronic package further comprising redistribution traces extending from the interconnect pads toward the contacts of the first and second chips, the interconnect pads being electrically connected to the contacts of the first and second chips through the redistribution traces, and
   wherein the package substrate has an aperture therein in alignment with the interconnect pads, the package further comprising wire bonds extending through the aperture, the interconnect pads being connected to the terminals through the wire bonds.

2. A microelectronic package as claimed in claim 1 wherein the interconnect pads include one or more common interconnect pads, each common interconnect pad being connected to at least one contact of the first chip and to at least one contact of the second chip.

3. A microelectronic package as claimed in claim 1 wherein the width of the interconnect zone is less than 1 mm.

4. A microelectronic package as claimed in claim 1 wherein the first edge of the first chip is 300 microns or less from the second edge of the second chip.

5. A microelectronic package as claimed in claim 1 wherein the interconnect pads are supported on the front surface of at least one of the first and second chips.

6. A microelectronic package as claimed in claim 5 wherein the front surfaces of the first and second chips face downwardly toward the upper surface of the package substrate.

7. A microelectronic package as claimed in claim 1 wherein the redistribution traces extend to the contacts of the first and second chips.

8. A microelectronic package as claimed in claim 1 further comprising redistribution bond pads disposed adjacent the contacts of the first and second chips and electrically connected thereto, the redistribution traces extending to the redistribution bond pads.

9. A microelectronic package as claimed in claim 8 further comprising wire bonds connecting the redistribution bond pads to the contacts of the first and second chips.

10. A microelectronic package as claimed in claim 1 wherein at least portions of the redistribution traces are carried on the front surfaces of the first and second chips.

11. A microelectronic package comprising:
    (a) a package substrate having upper and lower surfaces and terminals at the lower surface;
    (b) first and second chips disposed above the package substrate, each of the first and second chips having a front face, a rear face and contacts at the front face disposed in one or more columns extending in a column direction, the first and second chips being offset from one another by a center-to-center offset distance in a lateral direction transverse to the column direction;
    (c) interconnect pads disposed in an elongated interconnect zone having a width less than the offset distance, the interconnect pads facing toward the package substrate at least some of the interconnect pads being electrically connected to at least some of the contacts of the first and second chips, at least some of the interconnect pads being electrically connected to at least some of the terminals of the package substrate
    wherein each of the first and second chips has first and second edges extending in the column direction and the front surfaces of the first and second chips are substantially coplanar with one another, the first edge of the first chip being juxtaposed with the second edge of the second chip, the interconnect pads being disposed adjacent the juxtaposed first and second edges,
    wherein the package substrate has an aperture therein in alignment with the interconnect pads, the package further comprising wire bonds extending through the aperture, the interconnect pads being connected to the terminals through the wire bonds, the package further comprising a redistribution interposer having an inner surface confronting the front surfaces of the first and second chips and an outer surface facing away from the first and second chips, the interconnect pads being carried on the redistribution interposer.

12. A microelectronic package as claimed in claim 11 wherein the interconnect pads are at the outer surface of the redistribution interposer, and wherein the outer surface of the redistribution interposer faces downwardly toward the package substrate.

13. A microelectronic package as claimed in claim 11 wherein the interconnect pads are at the inner surface of the redistribution interposer, and wherein the inner surface of the redistribution interposer faces downwardly toward the package substrate.

14. A microelectronic package as claimed in claim 11 wherein the interconnect pads are supported on the front surface of at least one of the first and second chips.

15. A microelectronic package as claimed in claim 11 wherein the redistribution traces extend to the contacts of the first and second chips.

16. A microelectronic package comprising:
(a) a package substrate having upper and lower surfaces and terminals at the lower surface;
(b) first and second chips disposed above the package substrate, each of the first and second chips having a front face, a rear face and contacts at the front face disposed in one or more columns extending in a column direction, the first and second chips being offset from one another by a center-to-center offset distance in a lateral direction transverse to the column direction;
(c) interconnect pads disposed in an elongated interconnect zone having a width less than the offset distance, the interconnect pads facing toward the package substrate at least some of the interconnect pads being electrically connected to at least some of the contacts of the first and second chips, at least some of the interconnect pads being electrically connected to at least some of the terminals of the package substrate wherein each of the first and second chips has first and second edges extending in the column direction and the front surfaces of the first and second chips are substantially coplanar with one another, the first edge of the first chip being juxtaposed with the second edge of the second chip, the interconnect pads being disposed adjacent the juxtaposed first and second edges, the microelectronic package further comprising redistribution traces extending from the interconnect pads toward the contacts of the first and second chips, the interconnect pads being electrically connected to the contacts of the first and second chips through the redistribution traces, and wherein the package substrate has connection pads at the top surface electrically connected to the terminals and wherein the interconnect pads are bonded to the connection pads.

17. A microelectronic package as claimed in claim 16 wherein the interconnect pads include one or more common interconnect pads, each common interconnect pad being connected to at least one contact of the first chip and to at least one contact of the second chip.

18. A microelectronic package as claimed in claim 16 wherein the interconnect pads are supported on the front surface of at least one of the first and second chips.

19. A microelectronic package as claimed in claim 16 wherein the redistribution traces extend to the contacts of the first and second chips.

20. A microelectronic package as claimed in claim 16 wherein at least portions of the redistribution traces are carried on the front surfaces of the first and second chips.

* * * * *